(12) United States Patent
Qin et al.

(10) Patent No.: US 12,249,299 B2
(45) Date of Patent: Mar. 11, 2025

(54) SINGLE BITLINE SRAM PIXEL AND METHOD FOR DRIVING THE SAME

(71) Applicant: OmniVision Technologies, Inc., Santa Clara, CA (US)

(72) Inventors: Qing Qin, Sunnyvale, CA (US); Hoon Ryu, San Diego, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 179 days.

(21) Appl. No.: 17/962,956

(22) Filed: Oct. 10, 2022

(65) Prior Publication Data

US 2024/0119917 A1    Apr. 11, 2024

(51) Int. Cl.
| | | |
|---|---|---|
| *G09G 5/393* | (2006.01) |
| *G09G 3/00* | (2006.01) |
| *G09G 3/36* | (2006.01) |
| *G11C 11/412* | (2006.01) |
| *G11C 11/419* | (2006.01) |
| *H10B 10/00* | (2023.01) |

(52) U.S. Cl.
CPC ........... *G09G 5/393* (2013.01); *G09G 3/3648* (2013.01); *G11C 11/412* (2013.01); *G11C 11/419* (2013.01); *H10B 10/12* (2023.02); *G09G 3/001* (2013.01); *G09G 2300/0842* (2013.01); *G09G 2310/08* (2013.01); *G09G 2320/041* (2013.01); *G09G 2330/021* (2013.01); *G09G 2360/128* (2013.01); *G09G 2360/18* (2013.01)

(58) Field of Classification Search
CPC ...... G09G 5/393; G09G 3/3648; G09G 3/001; G09G 2300/0842; G09G 2310/08; G09G 2320/041; G09G 2330/021; G09G 2360/128; G09G 2360/18; H10B 10/12; G11C 11/412; G11C 11/419
USPC .......................................................... 345/98
See application file for complete search history.

(56) References Cited

U.S. PATENT DOCUMENTS

| | | | |
|---|---|---|---|
| 7,256,760 B2* | 8/2007 | Yamazaki ........... H01L 27/1248 |
| | | | 345/55 |
| 11,574,586 B1* | 2/2023 | Pappas ................. G09G 3/3233 |
| 2009/0207325 A1* | 8/2009 | Sugimoto .......... G02B 26/0841 |
| | | | 348/E5.137 |
| 2021/0090493 A1* | 3/2021 | Hudson ................ G09G 3/3241 |
| 2022/0102583 A1* | 3/2022 | Baumheinrich ... G02B 6/12004 |

* cited by examiner

*Primary Examiner* — Kwin Xie
(74) *Attorney, Agent, or Firm* — Larry E. Henneman, Jr.; Henneman & Associates, PLC

(57) ABSTRACT

A novel bit storage circuit includes a first voltage supply line, a second voltage supply line, a bit line, a latch, a first switching transistor, and a blocking transistor. The latch includes an input and an output. The first switching transistor includes a first terminal, a second terminal, and a control terminal. The first switching transistor is operative to provide a conductive path and a non-conductive path between the bit line and the input of the latch responsive to a first control signal being asserted on the control terminal of the first switching transistor. The blocking transistor includes a control terminal and is operative to selectively provide a conductive path and a non-conductive path between the input of the latch and the second voltage supply line responsive to a second control signal. The blocking transistor facilitates the use of a single bit line.

15 Claims, 11 Drawing Sheets

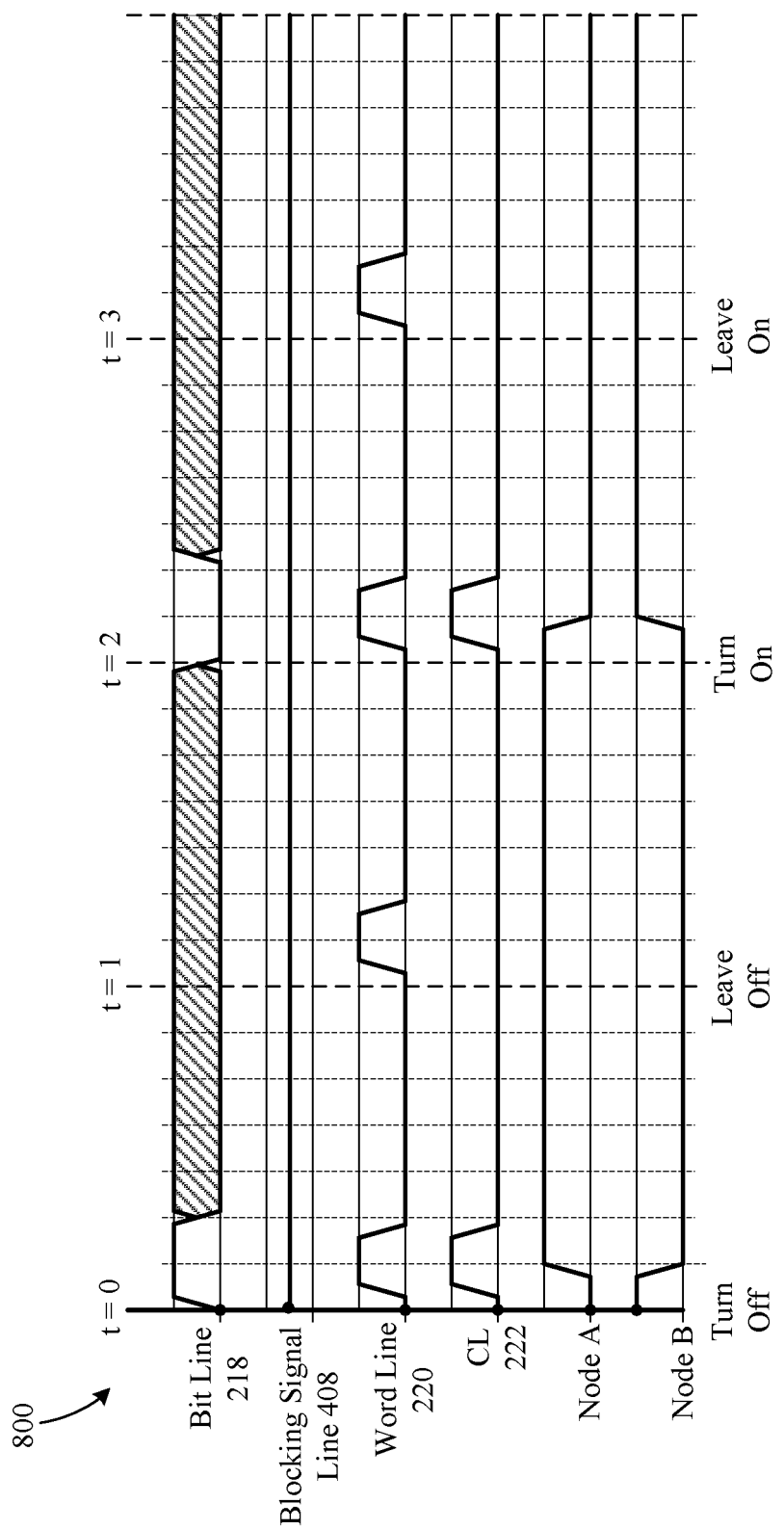

SINGLE BITLINE SRAM PIXEL AND METHOD FOR DRIVING THE SAME

BACKGROUND OF THE INVENTION

Field of the Invention

This invention relates generally to digital displays, and more particularly to digital display pixel circuitry.

DESCRIPTION OF THE BACKGROUND ART

As digital displays (e.g., liquid crystal on silicon displays, micro light emitting diode displays, etc.) are being incorporated into more and more devices, there is a constant need to improve their performance. A typical digital display includes drive circuitry that is electrically connected to an m×n array of pixels arranged into a plurality of m columns and n rows. Each row of pixels is electrically connected to a respective row select line, and each column of pixels is electrically connected to respective data line set. Each data line set typically includes a bit line and an inverse bit line. When a bit of data is to be written to an individual pixel circuit, that bit value is asserted on the bit line while the inverse of that value is simultaneously asserted on the inverse bit line. In other words, writing a single bit of data to a pixel circuit requires asserting two different bit values on a respective two different signal lines.

In driving an array of pixel circuits, a great deal of power is consumed by driving the bit lines. Of course, high power consumption substantially degrades the overall performance of a digital display. For example, high power consumption of a display device drains the host device battery very fast and, therefore, limits what type of host devices into which the display can be incorporated. High power consumption also leads to heat dissipation problems, which impose substantial design constraints on the display device.

There have been attempts to alleviate the power consumption challenge in pixel array circuits by designing more complex pixel circuits. However, these more complex designs are very difficult, and oftentimes not possible, to implement due to the very small size constraints of individual pixels.

SUMMARY

The present invention overcomes problems associated with the prior art by providing a seven transistor circuit that fits in an array having a pitch no greater than 3 μm. Four of the transistors function as a latch. One of the transistors facilitates the selective access or hold of the individual transistor in a row of enabled transistors. Another of the transistors blocks current to facilitate the transition of the latch between digital values using only a single bit line.

An example bit storage circuit includes a first voltage supply line, a second voltage supply line, a bit line, a latch, a first switching transistor, and a blocking transistor. The latch has an input and an output. The first switching transistor has a first terminal, a second terminal, and a control terminal. The first switching transistor is operative to selectively provide a conductive path and a non-conductive path between the bit line and the input of the latch, responsive to a first control signal being asserted on the control terminal of the first switching transistor. The blocking transistor includes a control terminal and is operative to selectively provide a conductive path and a non-conductive path between the input of the latch and the second voltage supply line, responsive to a second control signal.

The example bit storage circuit can additionally include a second switching transistor having a first terminal, a second terminal, and a control terminal. The second switching transistor can selectively provide a conductive path and a non-conductive path between the bit line and the input of the latch, responsive to a third control signal being asserted on the control terminal of the second switching transistor. The first switching transistor and the second switching transistor can be coupled in series between the bit line and the input of the latch.

In an example bit storage circuit, the latch can include a first p-channel transistor, a first n-channel transistor, a second p-channel transistor, and a second n-channel transistor. The first p-channel transistor has a source terminal coupled to the first voltage supply line, a drain terminal coupled to the output of the latch, and a gate terminal coupled to the input of the latch. The first n-channel transistor has a source terminal coupled to the second voltage supply line, a drain terminal coupled to the output of the latch, and a gate terminal coupled to the input of the latch. The second p-channel transistor has a source terminal coupled to the first voltage supply line, a drain terminal coupled to the input of the latch, and a gate terminal coupled to the output of the latch. The second n-channel transistor has a source terminal coupled to the second voltage supply line, a drain terminal selectively coupled to the input of the latch via the blocking transistor, and a gate terminal coupled to the output of the latch. Alternatively, the second n-channel transistor can have its source terminal selectively coupled to the second voltage supply line via the blocking transistor, its drain terminal coupled to the input of the latch, and its gate terminal coupled to the output of the latch.

The example bit storage circuits can be used in a display device. For example, the bit storage circuit can additionally include a pixel electrode coupled to the output of the latch. The pixel electrode can be a reflective pixel mirror of a liquid crystal on silicon ((LCoS) device.

Example bit storage circuits can include no more than seven transistors. In addition, in example systems, the bit storage circuit can operate with a single bit line and is connected to no more than one bit line.

Example bit storage circuits can additionally include a pulse generator having an output coupled to the control terminal of the blocking transistor. The pulse generator can be included, for example, in a row address decoder and can coordinate the generated pulses with row enable signals generated by the row address decoder. Alternatively, the control terminal of the blocking transistor can be coupled to a third voltage supply line having a constant voltage between a voltage of the first voltage supply line and a voltage of the second voltage supply line. In this case, the second control signal can be the constant voltage, and the blocking transistor can thereby be maintained in a partially conducting state.

Example methods are also disclosed. An method for writing a data bit to a pixel of a display includes asserting a data bit on a bit line coupled to an input of a latch of the pixel and asserting a first control signal on a gate of a first transistor of the pixel. The first transistor, responsive to the first control signal, at least partially disables a second transistor of the pixel from affecting the voltage on the input of the latch. The example method additionally includes asserting an enable signal on a third transistor of the pixel to selectively couple the input of the latch to the bit line, and then changing the first control signal to re-enable the second transistor of the pixel to affect the voltage on the input of the latch. The example method additionally includes asserting a disable signal on the third transistor to selectively decouple the bit line from the input of the latch.

Example methods can additionally include asserting a second enable signal on a fourth transistor of the pixel, and asserting a second disable signal on the fourth transistor of the pixel. Asserting the enable signal on the third transistor and asserting the second enable signal on the fourth transistor causes the third transistor and the fourth transistor to electrically couple the bit line to the input of the latch. Asserting the enable signal on the third transistor and the second disable signal on the fourth transistor isolates the bit line from the input of the latch. Asserting the disable signal on the third transistor and the second enable signal on the fourth transistor isolates the bit line from the input of the latch.

An example display includes a first voltage supply line, a second voltage supply line, an array of pixel electrodes arranged in columns and rows, a plurality of row enable lines, a plurality of blocking signal lines, a plurality of bit lines, and an array of pixel circuits arranged in columns and rows. Each of the pixel circuits can include a latch, a first switching transistor, and a blocking transistor. The latch has an input coupled to one of the bit lines and an output coupled to one of the pixel electrodes. The first switching transistor has a control terminal coupled to one of the row enable lines. The first switching transistor is operative to provide a conductive path and a non-conductive path between the bit line and the input of the latch responsive to a first control signal being asserted on the row enable line. The blocking transistor includes a control terminal coupled to one of the blocking signal lines and is operative to selectively provide a conductive path and a non-conductive path between the input of the latch and the second voltage supply line responsive to a second control signal asserted on the coupled blocking signal line.

The example display can additionally include a plurality of column enable lines. Each pixel includes a second switching transistor having a control terminal coupled to one of the column enable lines. The second switching transistor is operative to selectively provide a conductive path and a non-conductive path between the bit line and the input of the latch responsive to a third control signal being asserted on the coupled column enable line. The first switching transistor and the second switching transistor are coupled in series between the bit line and the input of the latch.

In the example display, each of the latches includes a first p-channel transistor, a first n-channel transistor, a second p-channel transistor, and a second n-channel transistor. The first p-channel transistor has a source terminal coupled to the first voltage supply line, a drain terminal coupled to the output of the latch, and a gate terminal coupled to the input of the latch. The first n-channel transistor has a source terminal coupled to the second voltage supply line, a drain terminal coupled to the output of the latch, and a gate terminal coupled to the input of the latch. The second p-channel transistor has a source terminal coupled to the first voltage supply line, a drain terminal coupled to the input of the latch, and a gate terminal coupled to the output of the latch. The second n-channel transistor has a source terminal coupled to the second voltage supply line, a drain terminal selectively coupled to the input of the latch via the blocking transistor, and a gate terminal coupled to the output of the latch. Alternatively, the second n-channel transistor can have a source terminal selectively coupled to the second voltage supply line via the blocking transistor, a drain terminal coupled to the input of the latch, and a gate terminal coupled to the output of the latch.

In the example display, each the pixel circuit includes no more than seven transistors. In a particular embodiment, the example pixel circuits include exactly seven transistors. In the example display, each pixel circuit is coupled to no more than one of the bit lines. More particularly, each pixel circuit is coupled to exactly one of the bit lines.

An example array of bit storage circuits formed in and on a p-type semiconductor substrate is also disclosed. Each bit storage circuit includes at least one n-well formed in the p-type substrate, a first p-type doped region formed in the at least one n-well, a second p-type doped region formed in the at least one n-well, and a third p-type doped region formed in the at least one n-well. Each bit storage circuit additionally includes a first n-type doped region formed in the p-type substrate, a second n-type doped region formed in the p-type substrate, a third n-type doped region formed in the p-type substrate, a fourth n-type doped region formed in the p-type substrate, a fifth n-type doped region formed in the p-type substrate, a sixth n-type doped region formed in the p-type substrate, and a seventh n-type doped region formed in the p-type substrate.

Each bit storage circuit additionally includes a first polysilicon gate, a second polysilicon gate, a third polysilicon gate, a fourth polysilicon gate, a fifth polysilicon gate, a sixth polysilicon gate, and a seventh polysilicon gate. The first polysilicon gate is formed over a first area of the p-type substrate disposed between the first n-type doped region and the second n-type doped region. The second polysilicon gate is formed over a second area of the p-type substrate disposed between the second n-type doped region and the third n-type doped region. The third polysilicon gate is formed over a third area of the p-type substrate disposed between the third n-type doped region and the fourth n-type doped region. The fourth polysilicon gate is formed over a fourth area of the p-type substrate disposed between the fourth n-type doped region and the fifth n-type doped region. The fifth polysilicon gate is formed over a first area of the at least one n-well disposed between the first p-type doped region and the second p-type doped region. The a sixth polysilicon gate is formed over a second area of the at least one n-well disposed between the second p-type doped region and the third p-type doped region. The seventh polysilicon gate is formed over a fifth area of the p-type substrate disposed between the sixth n-type doped region and the seventh n-type doped region.

The example array of bit storage units additionally includes one or more conductive layers formed over the substrate and the polysilicon gates. The one more conductive layers include multiple conductive paths that provide interconnections between the components of the bit storage units. A first conductive path electrically couples the first n-type doped region to a bit line of the array. A second conductive path electrically couples the first polysilicon gate to a first control line of the array. A third conductive path electrically couples the second polysilicon gate to a second control line of the array. A fourth conductive path electrically couples the third polysilicon gate to a third control line of the array. A fifth conductive path electrically couples the third n-typed doped region, the first p-typed doped region, the sixth polysilicon gate, and the seventh polysilicon gate. A sixth conductive path electrically couples the fourth polysilicon gate, the fifth polysilicon gate, the first p-type doped region, and the sixth n-type doped region. A seventh conductive path electrically couples the second p-type doped region to a first voltage supply line of the array. An eighth conductive path electrically couples the fifth n-type doped region and the seventh n-type doped region to a second voltage supply line of the array. The second voltage supply line provides a lower voltage than the first voltage supply line. The array has a pitch no greater than 3 µm.

In an example array of bit storage circuits, the first control line of the array can be a row enable line. The second control line of the array can be a column enable line, and the sixth conductive path is electrically coupled to a pixel mirror.

In a particular example array of bit storage circuits, each of the first n-type doped region, the second n-type doped region, and the third n-typed doped region have an area that is larger than the area of the largest one of the fourth n-typed doped region, the fifth n-typed doped region, the sixth n-typed doped region, and the seventh n-typed doped region.

BRIEF DESCRIPTION OF THE DRAWINGS

The present invention is described with reference to the following drawings, wherein like reference numbers denote substantially similar elements:

FIG. 8 is another example timing diagram illustrating the driving of the pixel of FIG. 6;

DETAILED DESCRIPTION

The present invention overcomes the problems associated with the prior art, by providing a pixel mirror driving circuit that can be driven by a single bit line, that facilitates reading and writing to individual pixels, and/or that can hold data with or without the presence of an active word line signal. In the following description, numerous specific details are set forth (e.g., transistor types, specific voltages, specific display types, and so on) in order to provide a thorough understanding of the invention. Those skilled in the art will recognize, however, that the invention may be practiced apart from these specific details. In other instances, details of well-known digital display manufacturing practices and components have been omitted, so as not to unnecessarily obscure the present invention.

Figure 1:
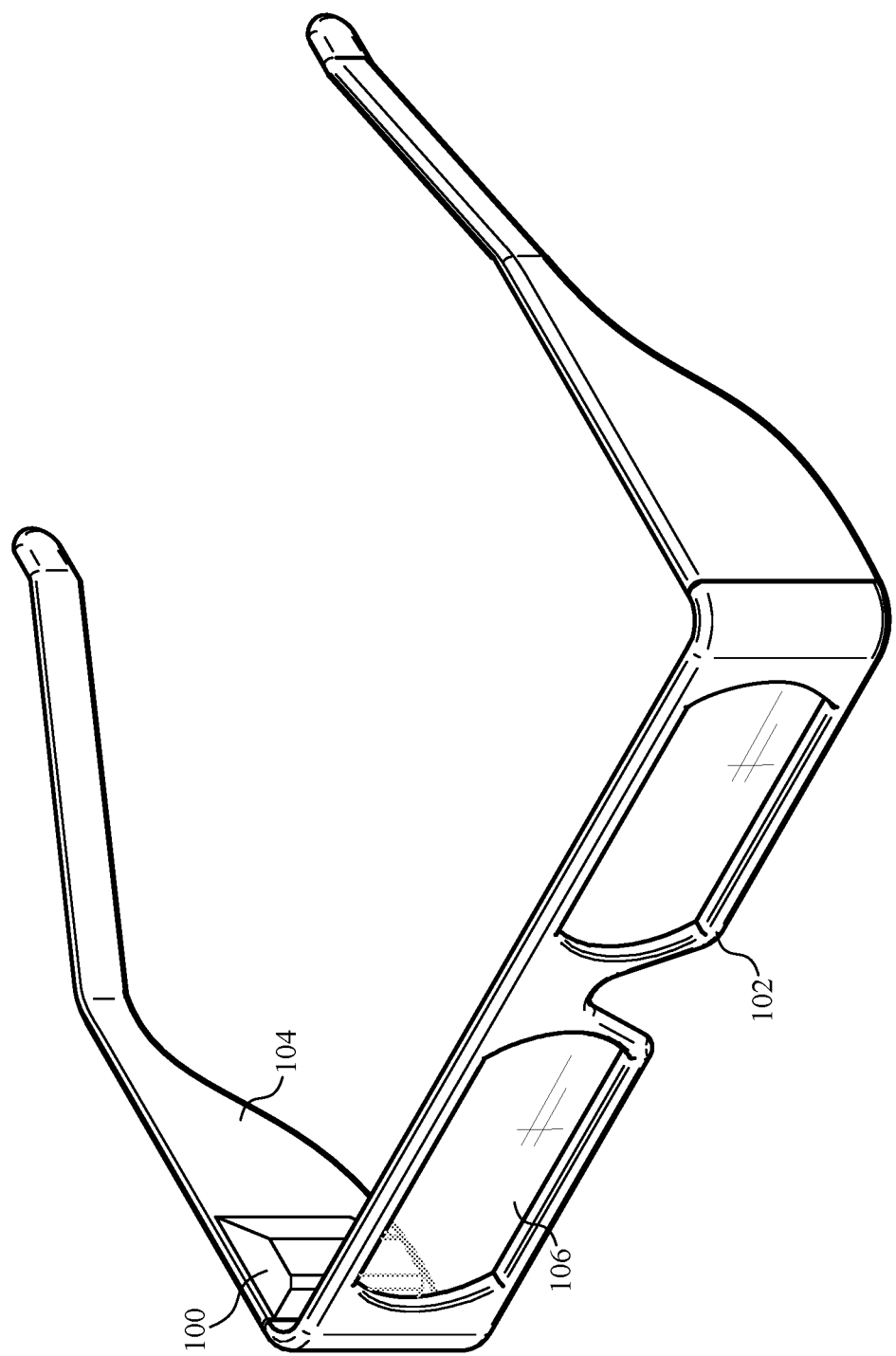
FIG. 1 is a perspective view of a pair of glasses including a digital display system.

FIG. 1 shows a digital display system 100 integrated into a hosting device, which is depicted by way of non-limiting example as a pair of glasses 102. More specifically, display system 100 is incorporated into a projector system that is fixed to the interior of an arm 104 of glasses 102 to project images directly onto a lens 106 of glasses 102. In this example, display system 100 is a liquid crystal on silicon (LCOS) display. Although display system 100 is depicted as an LCOS display, the invention may also be used in conjunction with other digital display types such as, for example, micro light emitting diode (µLED) display. Indeed, aspects of the present pixel circuitry can be advantageously incorporated into memory circuits unrelated to driving pixels of a display. In addition, glasses 102 are intended to illustrate one example environment. However, the displays and pixel circuitry disclosed herein can be used in any display environment.

Figure 2:
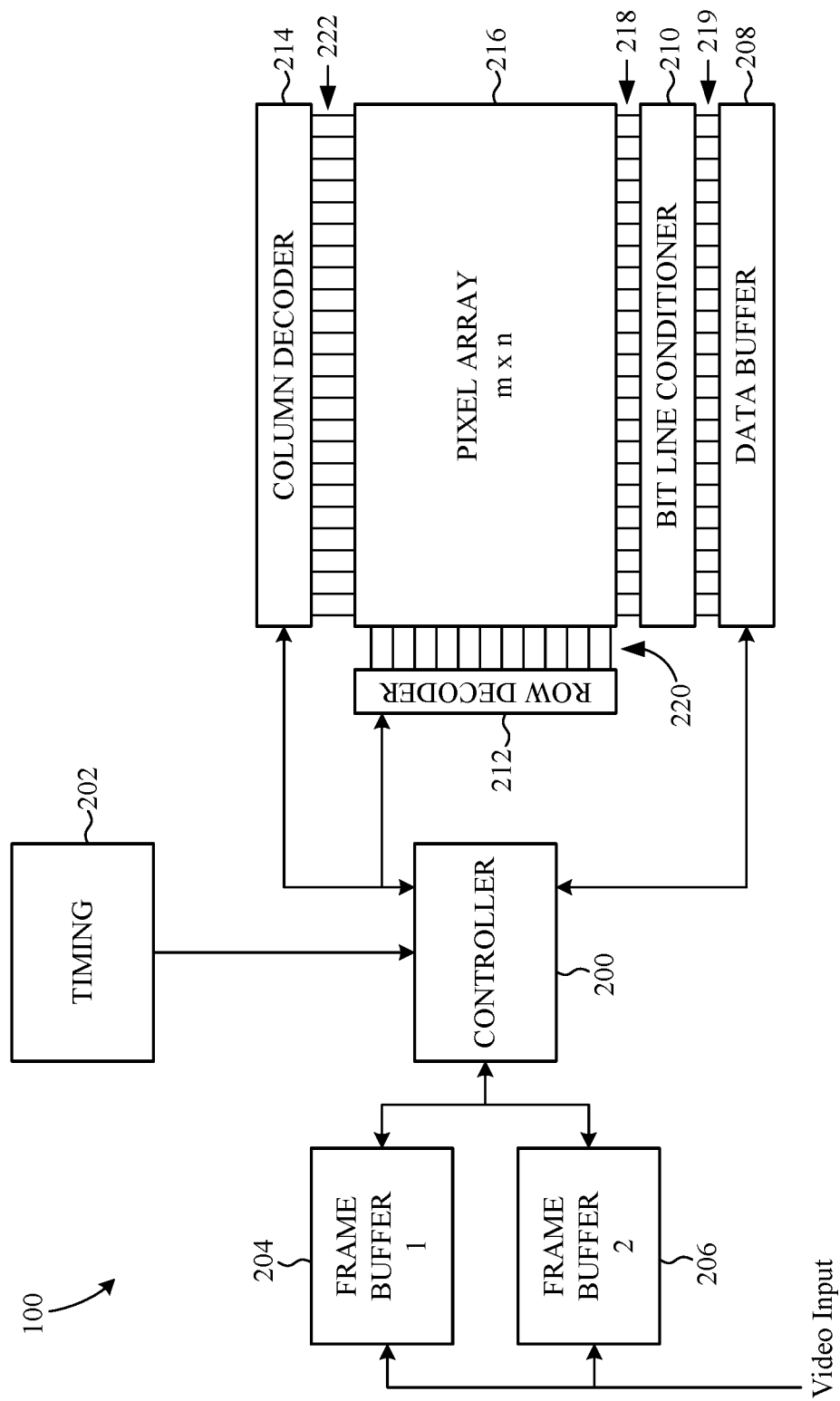
FIG. 2 is a block diagram showing components of the digital display system of FIG. 1.

FIG. 2 is a block diagram showing example components of digital display system 100 in greater detail. Display system 100 includes a controller 200, a timing generator 202, a first frame buffer 204, a second frame buffer 206, a data buffer 208, a bit line conditioner 210, a row decoder 212, a column decoder 214, and a pixel array 216.

Controller 200 is coupled to receive timing signals from timing generator 202, and configured to use those timing signals to coordinate the transfer of video data into frame buffers 204 and 206, and to drive the pixels of pixel array 216 to display images corresponding to the video data. For example, controller can "set" (e.g., turn on) and "reset" (e.g., turn off) each pixel of the display, so that each pixel is turned on for a portion of a predefined frame time. The amount of time that a particular is turned on is based on the value of a corresponding multi-bit intensity value stored in frame buffer 204 or 206.

First frame buffer 204 and second frame buffer 206 are each configured to receive an entire frame of video data and are used by controller 200 in alternating fashion. While one frame of video from first frame buffer 204 is used to determine the signals asserted on pixel array 216, a subsequent frame of video data is being loaded into second frame buffer 206. Then, when the frame of video data from the second frame buffer 206 is being used by controller 200 to determine the signals asserted on pixel array 216, a next frame of video data is being loaded into first frame buffer 204, and so on.

Pixel array 216 is an (m)×(n) array of individual pixels, wherein (m) is the number of columns and (n) is the number of rows. Pixel array 216 displays video (e.g., a rapid series of images) by turning the individual pixels on for predetermined portions of a frame time corresponding to particular desired intensities. The individual pixels are turned on and off by latching data bits asserted on bit lines 218 by bit line conditioner 210. The pixels are enabled to latch the data bits being asserted on bit lines 218 by row enable signals from row decoder 212 and column enable signals from column decoder 214. The details of pixel array 216 will be described in greater detail with reference to FIGS. 3-7.

Data buffer 208 is configured to receive lines of data bits that, in this example, turn individual pixels of pixel array 216 on and off. Bit line conditioner 210 is configured to receive data bits from data buffer 208, via data lines 219, in the form of low power electrical states and assert more powerful signals onto bit lines 218 of pixel array 216, depending on the values of the original data bits. The internal circuitry and operation of bit line conditioner 210 and pixel array 216 will be discussed in greater detail hereinafter with reference to FIG. 4 and FIG. 5.

Row decoder 212 and column decoder 214, responsive to addresses and control signals from controller 200, enable the pixels of pixel array 216 to latch data bits being asserted on the bit lines by data buffer 208 and bit line conditioner 210. In order for a particular pixel to be enabled, it must be enabled by both column decoder 214 and row decoder 212.

Row decoder 212 is coupled between controller 200 and pixel array 216 and is configured to selectively assert row enable signals onto word lines 220 connected to the various pixel rows of pixel array 216. A row enable signal enables each pixel of the enabled row to load a data bit being asserted on a corresponding bit line 218 by data buffer 208. More specifically, row decoder 212 receives a series of row addresses from controller 200, and sequentially asserts an enable signal on a respective word line corresponding to each received row address.

Column decoder 214 is coupled between controller 200 and pixel array 216 and is configured, responsive to control signals from controller 200, to selectively assert column enable signals onto the various pixel column lines 222 of pixel array 216. Whereas row decoder 212 typically asserts an enable signal on one word line 220 at a time, column decoder 214 can simultaneously assert enable signals on some, all, or none of the column enable lines 222. Not asserting a column enable signal on a particular pixel column line 222 allows an associated pixel of an enabled row, to hold its prior data, notwithstanding the enable signal being asserted on its word line 220.

Figure 3:
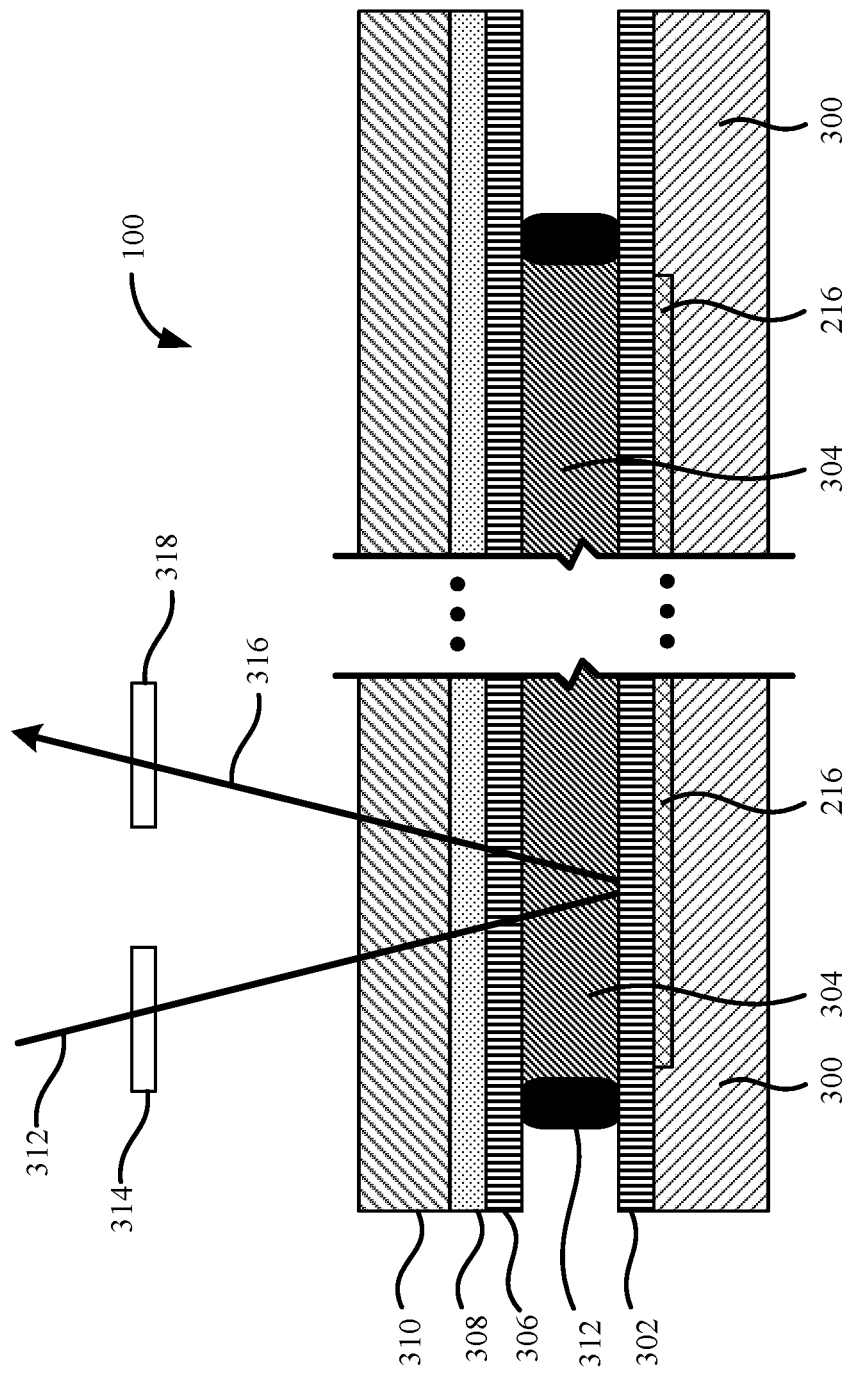
FIG. 3 is a cross-sectional side view of the digital display of FIG. 2.

FIG. 3 shows a cross-sectional side view of a portion of display system 100, which includes a silicon substrate (e.g., an integrated circuit chip) 300 having circuitry and a pixel array 216 formed thereon. Pixel array 216 includes a plurality of pixels (shown in FIG. 4) arranged in a plurality of columns and a plurality of rows. Because display system 100 is of the reflective type, those skilled in the art will recognize that the pixels of pixel array 216 include reflective pixel mirrors (shown in FIG. 6) that reflect incident light.

Display system further includes a lower liquid crystal alignment layer 302, a layer of liquid crystal material 304, an upper liquid crystal alignment layer 306, a transparent electrode 308, a transparent (e.g., glass) substrate 310, and a spacer 312, which retains liquid crystal layer 304 between lower and upper alignment layers 302 and 306. Transparent electrode 308 is formed on a bottom surface of transparent substrate 310 from a layer of, for example, indium tin oxide (ITO) and functions as a common electrode for display system 100. Alignment layers 302 and 306 are formed over pixel array 216 and transparent electrode 308, respectively, and facilitate alignment of the liquid crystals in liquid crystal layer 304 in a desired direction.

During operation of display system 100, incident light 312 is polarized in a first predetermined polarization state by a polarizer 314 and enters through the top surface of transparent substrate 310, passes through layers 308, 306, 304, and 302, and is reflected off the pixel mirrors of pixel array 216, and then passes again through the layers 302, 304, 306, 308, and 310, before exiting display system 100. The polarization of the light is altered by liquid crystal layer 304, depending on the electrical field applied across the liquid crystal. When transparent electrode 308 is held at a particular voltage, the electrical field across liquid crystal layer 304 is controlled by the voltages asserted on the individual pixel mirrors (not shown) of pixel array 216. Thus, the polarization of the incident light is spatially modulated in accordance with an image asserted on pixel array 216, and the light is output as a modulated beam 316. The modulated beam 316 is then analyzed by an analyzer 318 having a predetermined polarization orientation to produce a displayable image. The intensity of light displayed by each pixel thus depends on the change in polarization imparted by the liquid crystal under the effect of the electric field between the mirror of the pixel and common electrode 308.

Figure 4:
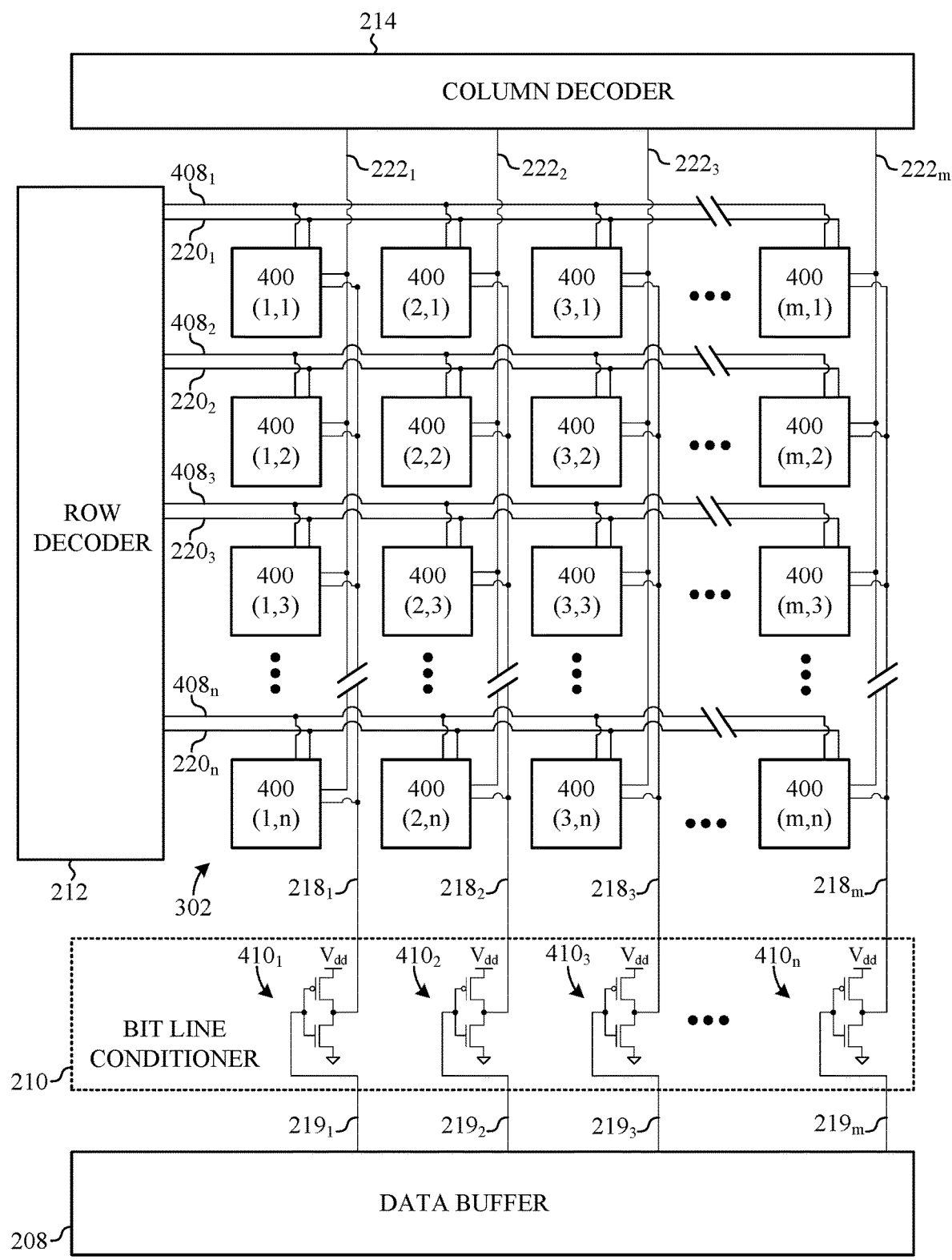
FIG. 4 is a diagram showing additional details of the pixel array of FIG. 2.

FIG. 4 is a diagram showing additional details of pixel array 216, which includes a plurality of pixels 400 arranged into an array of (m) columns and (n) rows. Each column of pixels 400 is electrically connected to a respective bit line 218 and a respective column control line 222. Bit lines 218 are electrically connected to data buffer 208 through bit line conditioner 210, and control lines 222 are electrically connected to column decoder 214. Each row of pixels 400 is electrically connected to a respective word line 220 and a blocking signal line 408. Row decoder 212 asserts enable signals and blocking signals (described below) on word lines 220 and blocking signal lines 408, respectively, to facilitate the latching of data being asserted on bit lines 218 into pixels 400 of the particular row.

Each bit line 218 is coupled to pixels 400 of a corresponding column of pixels 400, and is driven by a corresponding one of bit line conditioning circuits 410 of bit line conditioner 210. Each bit line conditioning circuit 410 is coupled to data buffer 208 by a respective one of data lines 219. Responsive to data buffer asserting a particular data bit onto one of data lines 219, the corresponding bit conditioning circuit 410 asserts a more powerful, inverted version of the data bit on the corresponding bit line 218. The details of an example one of conditioner circuits 410 is discussed in greater detail hereinafter, with reference to FIG. 5.

Column control lines 222 and word lines 220 work in conjunction to actuate specific individual pixels 400. To actuate a specific pixel 400, column decoder 214 asserts an enable signal (e.g., a digital high value) on the control line 222 associated with the particular column of that pixel. Simultaneously, row decoder 212 asserts an enable signal (e.g., a digital high value) on the word line 220 associated with the row of the particular pixel. Responsive to enable signals being simultaneously asserted on both the associated word line 220 and the associated column line 222, the particular pixel 400 will latch/load whatever data value is being asserted on the bit line 218 associated with pixel 400.

Row decoder 212 also asserts a signal on blocking signal line 408. The signals asserted on blocking signal line 408 facilitate the latching of particular bit values into the pixels of the associated row, thereby enabling the use of a single bit line for each column of pixels, as opposed to the dual bit lines required in the prior art. The use of a single bit line and the use of blocking signals advantageously provide a great reduction in power consumption and will be described in greater detail with reference to FIG. 5 and FIG. 6.

Figure 5:
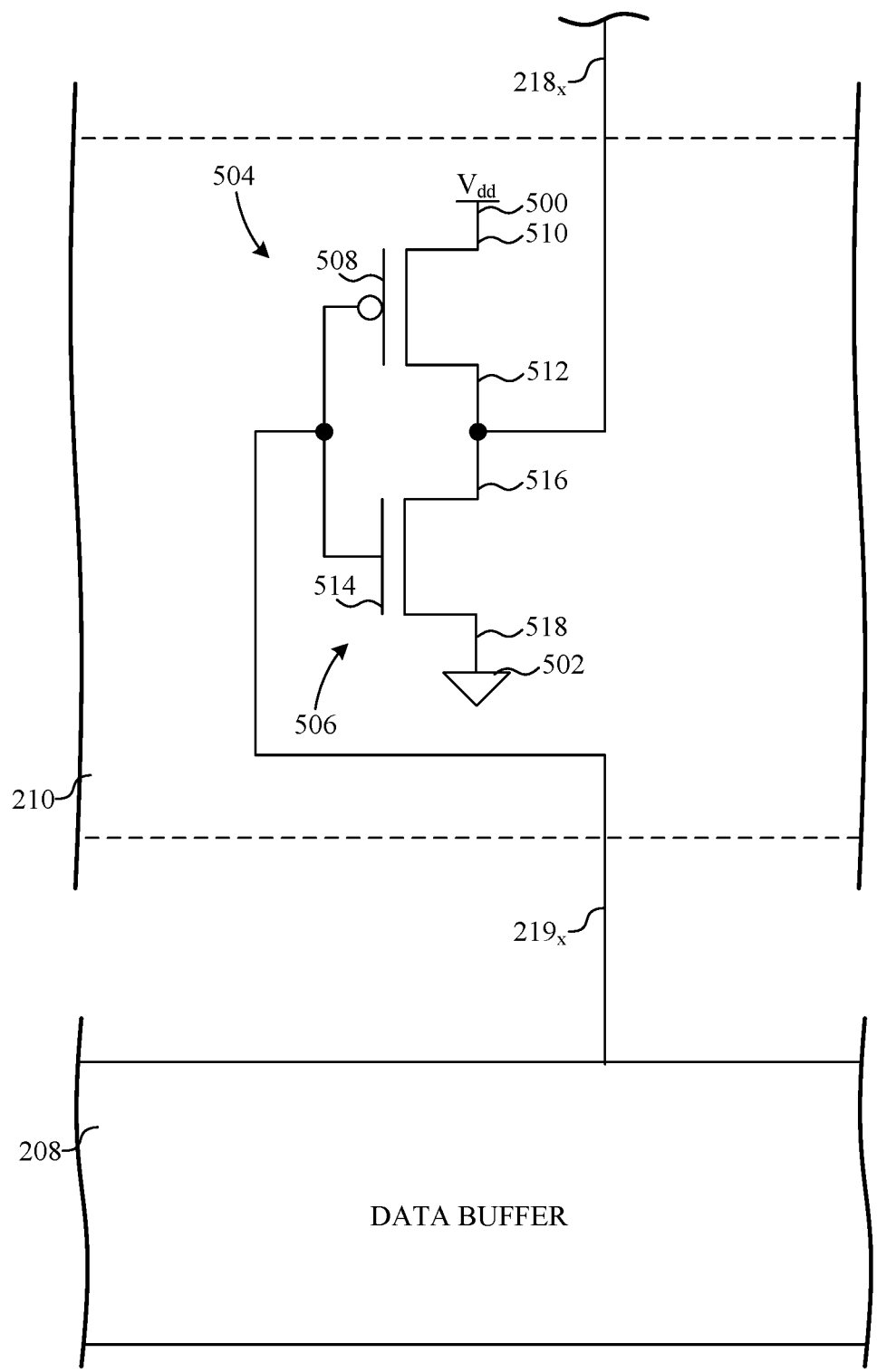
FIG. 5 is an enlarged circuit diagram of a single bit line conditioner circuit of FIG. 4.

FIG. 5 shows a circuit diagram of an example one of bit line conditioning circuits 410, which includes digital high voltage supply 500 (Vdd), a digital low voltage supply 502, a transistor 504, and a complementary transistor 506. In this example, transistor 504 is a PMOS transistor, and complementary transistor 506 is an NMOS transistor. Transistor 504 includes a gate 508, a first conducting terminal 510, and a second conducting terminal 512. Gate 508 is electrically connected to data buffer 208 via data line 219. First conducting terminal 510 is connected to Vdd node 500, and second conducting terminal 512 is connected to bit line 218, which extends into a respective pixel column of pixel array 216. Complementary transistor 506 includes a gate 514, a first conducting terminal 516, and a second conducting terminal 518. Gate 514 is also electrically connected to gate 508 and, therefore, to data line 219. First conducting terminal 516 is electrically connected to low voltage node 502. First conducting terminal 516 is connected to second conducting terminal 512 of transistor 504 and, therefore, to bit line 218.

Bit conditioning circuit 410 operates as follows. When a digital high signal from buffer 208 is asserted on data line 219 and gates 508 and 514, it causes transistor 506 to operate in a conducting state, thereby pulling bit line 218 low. At the same time, the same digital high signal asserted on gate 508 of complementary transistor 504 causes complementary transistor 504 to operate in a non-conducting state, thereby preventing high voltage supply 500 from pulling bit line 218 high. When a digital low signal from data buffer 208 is asserted on gates 508 and 514, it causes transistor 506 to operate in a non-conducting state, thereby preventing low voltage node 502 from pulling bit line 218 low. At the same time, this digital low signal on gate 508 causes complementary transistor 504 to operate in a conducting state, thereby pulling bit line 218 high. Thus, bit line conditioning circuit 504, responsive to a digital value asserted on data line 219, is operative to assert an inverted digital value on data line 218.

Figure 6:
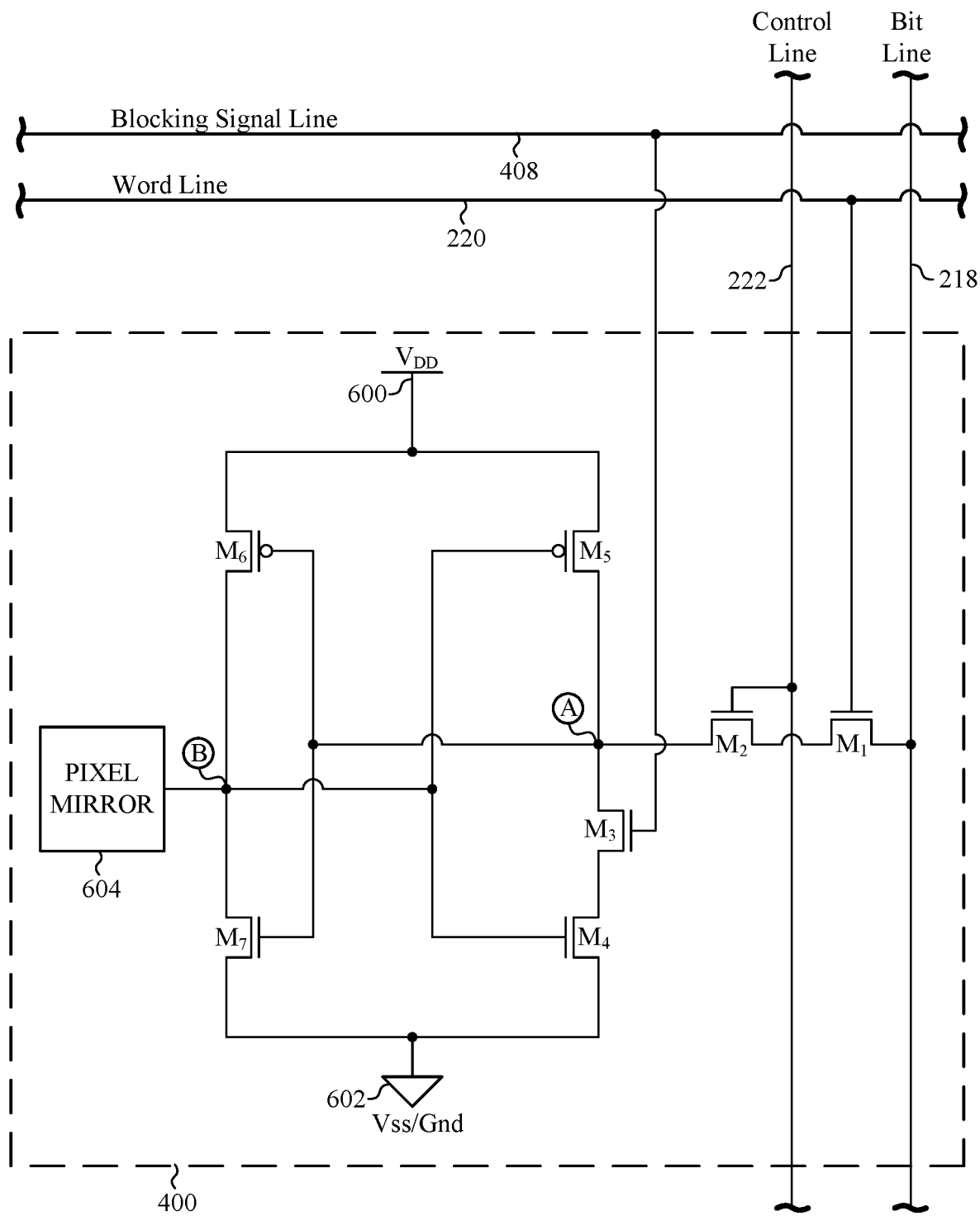
FIG. 6 is a circuit diagram of an example one of the pixels of the pixel array of FIG. 4.

FIG. 6 shows a circuit diagram of a pixel 400 of the pixel array 302 connected to a bit line 218, a column control line 222, a word line 220, and a blocking signal line 408. Pixel 400 includes a digital high voltage supply 600, a digital low voltage supply 602, a first transistor M1, a second transistor M2, a third transistor M3, a fourth transistor M4, a fifth transistor M5, a sixth transistor M6, a seventh transistor M7, and a pixel mirror 604. High voltage supply 600 is configured to supply a relatively constant voltage of, for example, 5 volts to the circuitry of pixel 400. Low voltage supply 602 provides a common low voltage (e.g., ground or 0 volts) to the circuitry of pixel 400.

Transistor M1 is an NMOS transistor and is electrically connected to provide a selectively conductive path between bit line 218 and transistor M2. The gate of transistor M1 is electrically connected to word line 220, and when a digital high signal is asserted on word line 220, transistor M1 provides a conductive path between bit line 218 and transistor M2. On the other hand, a digital low signal asserted on word line 220 and, therefore, the gate of transistor M1, will place transistor M1 in a non-conducting state, thereby isolating bit line 218 from transistor M2.

Transistor M2 is an NMOS transistor and is electrically connected to provide a selectively conductive path between transistor M1 and a node A of pixel 400. The gate of transistor M2 is electrically connected to column control line 222, and when a digital high signal is asserted on control line 222, transistor M2 provides a conductive path between transistor M1 and node A. A digital low signal asserted on control line 222 and, therefore, the gate of transistor M2, will place transistor M2 in a non-conducting state, thereby isolating transistor M1 from node A. So, when a digital high signal is asserted on both word line 220 and control line 222, both transistors M1 and M2 will be in a conducting state, and provide a conductive path between bit line 218 and node A. However, if a low signal is asserted on either or both of word line 220 and control line 222, one or both of transistors M1 and M2 will be in a non-conducting state, thereby isolating bit line 218 from node A.

Transistor M3 is an NMOS transistor that is electrically connected to provide a selectively conductive path between node A and transistor M4. The gate of transistor M3 is electrically connected to blocking signal line 408, and when a digital high signal is asserted on blocking signal line 408, transistor M3 provides a conductive path between node A and transistor M4. However, when a digital low signal is asserted on blocking signal line 408, transistor M3 is placed in a non-conducting state and blocks the flow of current between node A and transistor M4. The function and advantages of blocking transistor M3 will be described in greater detail below.

Transistor M4 is an NMOS transistor that is electrically connected to provide a selectively conductive path between transistor M3 and ground source 602. The gate of transistor M4 is electrically connected to a node B of pixel 400, and when node B is in a digital high state, transistor M4 forms a conductive path between transistor M3 and ground node 602. Oppositely, when node B is in a digital low state, transistor M4 is placed in a non-conducting state and isolates transistor M3 from ground source 602.

Transistor M5 is a PMOS transistor that is electrically connected to provide a selectively conductive path between node A and high voltage supply 600. The gate of transistor M5 is electrically connected to node B, and when node B is in a digital low state, transistor M5 forms a conductive path between node A and high voltage supply 600. When node B is in a digital high state, transistor M5 will be in a non-conducting state, thereby isolating node A from high voltage node 600.

Transistor M6 is also a PMOS transistor that is electrically connected between node B and high voltage supply 600. The gate of transistor M6 is electrically connected to node A, and when node A is in a digital low state, transistor M6 forms a conductive path between node B and high voltage supply 600. Conversely, when node A is in a digital high state, transistor M6 is placed in a non-conducting state, thereby isolating node B from high voltage supply 600.

Transistor M7 is an NMOS transistor that is electrically connected to provide a selectively conductive path between node B and ground supply 602. The gate of transistor M7 is electrically connected to node A, and when node A is in a digital high state, transistor M7 forms a conductive path between node B and ground supply 602. Conversely, when node A is in a digital low state, transistor M7 will be in a non-conducting state, thereby isolating node B from ground node 602.

Pixel mirror 604 is electrically connected to node B. The orientation of the liquid crystal material between pixel mirror 604 and transparent electrode 310 (shown in FIG. 3) depends on the voltage difference between node B and transparent electrode 310. Accordingly, the intensity of light output by the associated pixel 400 can be attenuated (e.g., turned on and off) by latching a digital high or digital low voltage onto node B.

It should be recognized that transistors M4-M7, together, operate to latch data from bit line 218 into pixel 400. That is, a digital high value asserted on node A will latch a digital low value onto node B, and asserting a digital low value on node A will latch a digital high value onto node B. Transistor M3 provides an important advantage by facilitating the efficient latching of data using only a single bit line, as opposed to prior designs that require a bit line and an inverse bit line. In particular, placing transistor M3 in a non-conducting state, by asserting a low signal on control line 222, blocks the flow of current from node A to ground supply 602, through transistor M4, which will be conducting when initiating a transition of node A from low to high. Without transistor M3, bit line 218 would be trying to pull node A high, at the same time transistor M4 is trying to hold node A low. Moreover, transistor 508 of bit line conditioning circuit 210 (FIG. 4), which is attempting to pull node A high, is a PMOS transistor, which is much weaker than NMOS transistor M4 that is attempting to hold node A low. Transistor M3 isolates node A from transistor M4 and ground supply 602, thereby alleviating this conflict and providing significant power savings.

In the foregoing example embodiment, transistor M3 is controlled by a signal on blocking signal line 408. In an alternate example embodiment, the gate of transistor M3 can be tied to a constant source of an intermediate voltage between high voltage supply 600 and ground supply 602. The particular constant voltage would be selected to limit, but not completely block, the current through transistor M3 and, therefore limit the current through transistor M4. This "throttling" of transistor M4 provides transistor 508 of bit line conditioning circuit 210 the ability to pull node A high and node B low, which would turn transistor M4 off and alleviate the conflict.

Figure 7:
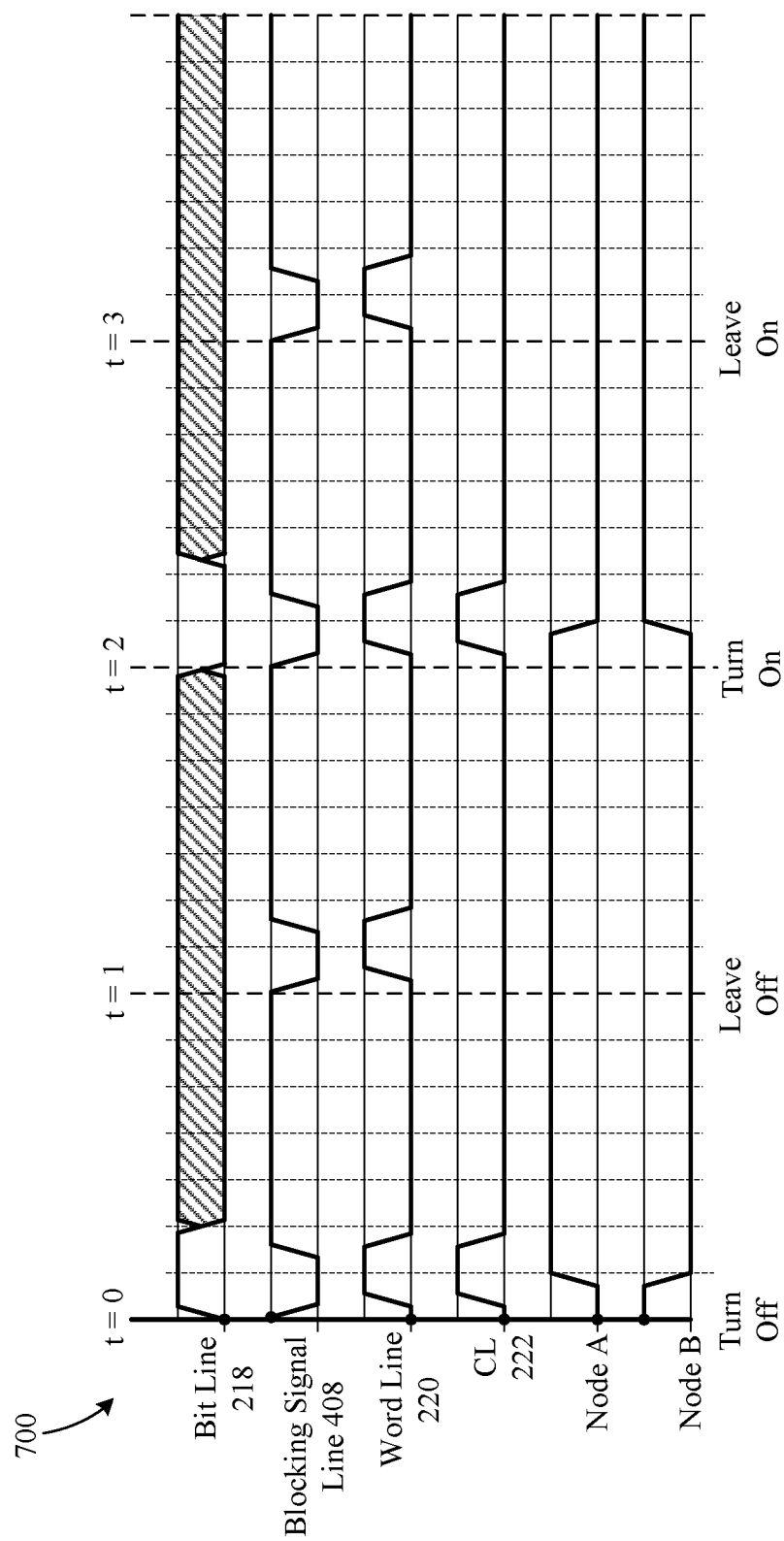
FIG. 7 is an example timing diagram illustrating the driving of the pixel of FIG. 6.

The operation of pixel 400 will be described with reference to the example timing diagram 700 of FIG. 7, wherein an example pixel is turned off, maintained in the off state, turned on, and maintained in the on state. Recall that controller 200 (FIG. 2) determines, based on the image data in frame buffers 204 and 206, at which point(s) during a frame time that each pixel 400 (FIG. 4) is turned on and off. The ability to maintain a latched bit (e.g., not writing a 1 over an existing 1, or writing a 0 over an existing 0) results in significant power savings.

Turn Pixel Off (Node A Transitions from 0 to 1 and Node B Transitions from 1 to 0):

With node B being in a high state and node A being in a low state at time t=0, a high signal is asserted on bit line 218 and a low signal is asserted on blocking signal line 408. The low state on blocking signal line 408 causes transistor M3 to be in a non-conducting state, thereby isolating node A from transistor M4.

Shortly after bit line 218 reaches a high state and blocking signal line 408 reaches a low state, a high signal is asserted on word line 220 and a high signal is asserted on control line 222. The high state on word line 220 and control line 222 causes transistors M1 and M2, respectively, to operate in a conducting state, thereby providing a conductive path between bit line 218 and node A. Because transistor M3 is preventing transistor M4 from pulling node A low, bit line 218 can easily pull node A high.

The high state on node A turns transistor M6 off, isolating node B from high supply 600. The high state on node A also turns transistor M7 on, thereby connecting node B to ground node 602 and pulling node B and pixel mirror 604 to a low state (pixel off).

The low state on node B causes transistor M5 to turn on, thereby connecting node A to high voltage supply 600. The low state on node B also causes transistor M4 to turn off, thereby isolating node A from ground source 602. With both transistors M3 and M4 "turned off", the pixel is latched into a stable state, with node A high.

After the circuit is latched into a stable state, blocking signal line 408 is brought back up to a high state which causes transistor M3 to provide a conductive path between node A and transistor M4. At this point in time, however, transistor M4 is turned off, so node A remains in a high state and node B remains in a low state without having to consume power from bit line 218.

Shortly after blocking signal line 408 is brought back up to a high state, both word line 220 and control line 222 are brought back down to a low state, thereby isolating node A from bit line 218. Although node A is disconnected from bit line 218 at this point in time, node A remains in a high state because it is now connected to high voltage source 600 through transistor M5, which is on. Bit line can then transition up and down as required to latch data into pixels of other rows.

Maintain Pixel Off (Node a Stays High (1) and Node B Stays Low (0)):

Just prior to time t=1, the pixel is still in the stable state described above, with node B in a low state and node A in a high state. At time t=1, bit line 218 will be either high or low, but the state of bit line 218 will not matter, because the prior state of the pixel is being maintained. A low signal will be asserted on blocking signal line 408, because other pixels in the row might be being turned off, as described in the preceding section. The low state on blocking signal line 408 causes transistor M3 to turn off, but this is of little consequence because transistor M4 is also off.

With bit line 218 at a high or low state and blocking signal line 408 at a low state, a high signal is asserted on word line 220, causing transistor M1 to be in a conductive state. However, because a low state remains on column control line 222, transistor M2 remains off, and bit line 218 remains isolated from node A. As a result, the pixel remains latched in its prior stable state (node A high and node B low), even though the row that the pixel resides in is enabled by a high signal on word line 220. Thus, by asserting low signals on selected control lines 222, prior latched data can be held in selected pixels of a row, even when other pixels of the same row are being loaded with new data. Stated another way, by using word lines 220 in combination with column control lines 222, every pixel of the array 216 can be accessed individually.

Eventually, a high signal is reasserted on blocking signal line 408, and a low signal is asserted on word line 220. These signals leave the pixel in its un-enabled, stable state, until the next time that it is accessed.

Turn Pixel on (Node A Transitions from 1 to 0 and Node B Transitions from 0 to 1:

Just before time t=2, node B is in a low state and node A is in a high state. Then, at time t=2, a low signal is asserted on bit line 218, and a low signal is asserted on blocking signal line 408. The low state on blocking signal line 408 causes transistor M3 to be in a non-conducting state, isolating node A from transistor M4.

Shortly after bit line 218 reaches the low state and blocking signal line 408 reaches the low state, a high signal is asserted on word line 220, and a high signal is asserted on column control line 222. The high states on word line 220 and control line 222 cause transistors M1 and M2, respectively, to operate in a conductive state, thereby connecting bit line 218 to node A.

Bit line 218 pulls node A low, temporarily overpowering PMOS transistor M5. The low state on node A turns transistor M6 on, thereby connecting node B to high voltage source 600. The low state of node A also causes transistor M7 to isolate node B from ground source 602, thereby bringing node B and pixel mirror 408 to a high state (on).

The high state of node B causes transistor M5 to isolate node A from high voltage source 600, thereby ending the temporary overpowering of PMOS transistor M5 by bit line 218. The high state of node B also causes transistor M4 to connect transistor M3 to ground node 602. With both transistors M3 and M4 turned on, node A is connected to ground source 602 and is, therefore, held in a low state.

Shortly after node A reaches the low state and node B reaches a high state, blocking signal line 408 is brought back up to a high state, which turns transistor M3 back on, thereby reconnecting node A to transistor M4. At this point, node A and node B are latched into a stable state.

Shortly after blocking signal line 408 is brought back up to a high state, both word line 220 and control line 222 are brought back down to a low state, thereby disconnecting node A from bit line 218. Thus, the pixel is left in its un-enabled, stable state, until the next time that it is accessed.

Maintain Pixel on (Node a Stays Low (0) and Node B Stays High (1)):

Just prior to time t=3, the pixel is still in the stable state described above, with node B in a high state and node A in a low state. At time t=3, bit line 218 will be either high or low, but the state of bit line 218 will not matter, because the prior state of the pixel is being maintained. A low signal will be asserted on blocking signal line 408, because other pixels in the row might be being turned off, as described above. The low state on blocking signal line 408 causes transistor M3 to turn off, but this will not affect the stable state that the pixel is in.

With bit line 218 at a high or low state and blocking signal line 408 at a low state, a high signal is asserted on word line 220, causing transistor M1 to be in a conductive state. However, because a low state remains on column control line 222, transistor M2 remains off, and bit line 218 remains isolated from node A. As a result, the pixel remains latched in its prior stable state (node A low and node B high), even though the row that the pixel resides in is enabled by a high signal on word line 220. Thus, by asserting low signals on selected control lines 222, prior latched data is held in selected pixels of a row, even when other pixels of the same row are being loaded with new data. Stated another way, by using word lines 220 in combination with column control lines 222, every pixel of the array 216 can be accessed individually.

Eventually, a high signal is reasserted on blocking signal line 408, and a low signal is asserted on word line 220. These signals leave the pixel in its un-enabled, stable state, until the next time that it is accessed.

As explained above, transistor M3 enables pixel 400 to operate with a single bit line, rather than two bit lines. By cutting the number of bit lines in half, pixel array 216 consumes much less power than that of traditional pixel arrays that require two bit lines for each pixel column. By consuming much less power, pixel array 216 also operates at a much lower temperature and, therefore, does not encounter as many challenges associated with high heat dissipation such as, for example, strict design constraints, premature pixel failure, short battery life, etc.

In this example embodiment, the signals on word line 220 and blocking signal line 408 are related and can be generated by row decoder 212, one from the other. For example, responsive to receiving a row address, row decoder 212 can pull the corresponding blocking signal line 408 low. Row decoder 212 can then invert and slightly delay the low signal on blocking signal line 408 to generate the slightly delayed high signal on word line 220.

Although transistor M3 is transitioned between a full "on" state and full "off" state, in the example of FIG. 6, transistor M3 may be controlled in other ways. For example, transistor M3 may be held at a constant state somewhere in between "on" and "off" and operate similar to a resistor or other current limiter, whereby only a small amount of current is allowed to pass. The current passing from node A to transistor M4 would be throttled just enough to give transistors M4 and M5 enough time to transition into the new, stable operating state, while preventing node A from being pulled to ground.

FIG. 8 shows an example timing diagram 800 of pixel 400, when driven with an alternate drive scheme. More specifically, the drive scheme of timing diagram 800 is substantially similar to timing diagram 700, except that blocking signal line 408 is held at a constant intermediate voltage, such that transistor M3 constantly operates in a state of partial conduction, wherein a small amount of current is constantly allowed to flow through transistor M3. The constant intermediate voltage asserted on the gate of transistor M3 via blocking signal line 408 is selected to throttle the current through transistor M3. This alleviates the conflict between transistor M4 trying to pull node A to ground and PMOS transistor 508 trying to pull node A high, when node A is transitioned from a digital low state to a digital high state.

Figure 9A:
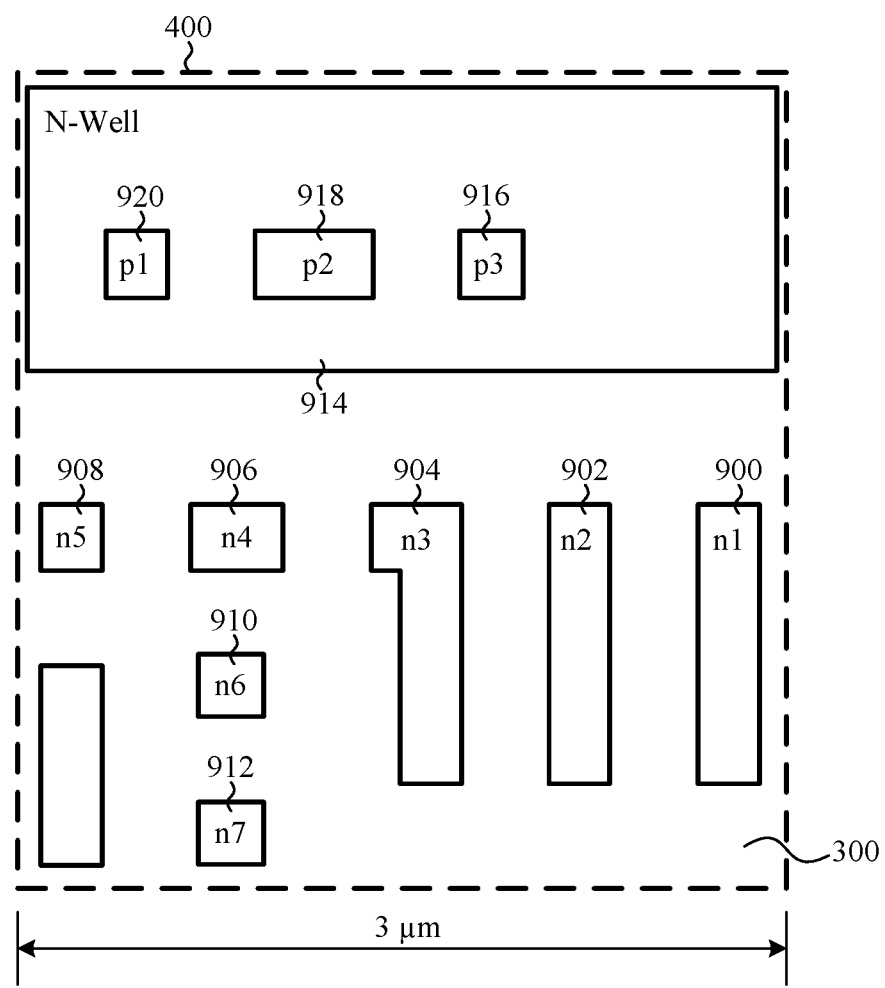
FIG. 9A shows the physical layout of n-type and p-type doped regions of the pixel of FIG. 6 on a p-type silicon substrate.
Figure 9B:
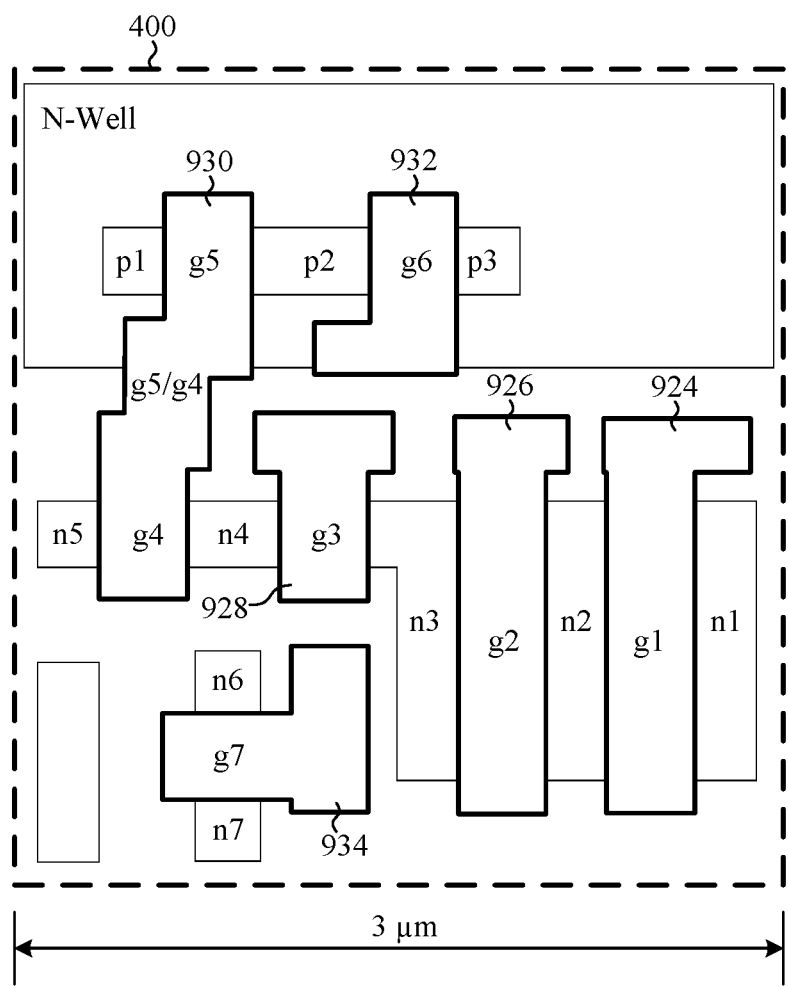
FIG. 9B shows the physical layout of polysilicon gate regions of the pixel of FIG. 6.
Figure 9C:
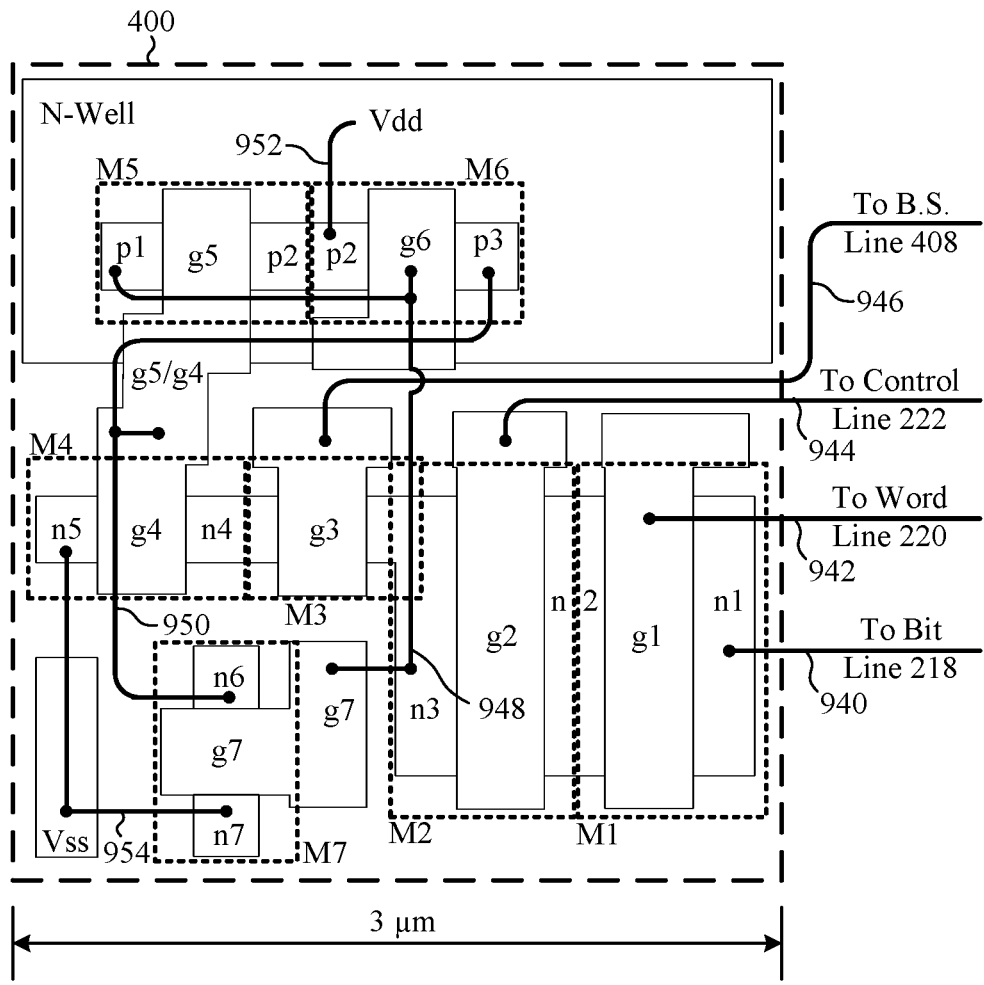
FIG. 9C shows the conductive interconnections between the various regions of the pixel of FIG. 6.

FIGS. 9A-9C show an example physical layout of various elements of pixel 400 formed in and on a p-type substrate. The pitch, which is defined as the distance between identical points in two adjacent pixels, is 3 μm or less. All seven of transistors M1-M7 are included in each pixel. Transistors M1-M7 in FIGS. 9A-9C correspond to the same transistors M1-M7 shown in the circuit diagram of FIG. 6.

FIG. 9A shows a portion of p-type substrate 300 (see FIG. 3), whereon and wherein the circuitry of a representative pixel 400 is formed. More specifically, FIG. 9A shows the semiconductor-doped regions of pixel 400, including a plurality of n-type doped regions 900, 902, 904, 906, 908, 910, 912, and n-well 914, and a plurality of p-type doped regions 916, 918, and 920, which are formed in n-well 914. N-type region 900 (n1) forms the source of transistor M1. N-type region 902 (n2) forms the drain of transistor M1 and the source of transistor M2. N-type region 904 (n3) forms the drain of transistor M2 and the source of transistor M3. N-type region 906 (n4) forms the drain of transistor M3 and the source of transistor M4. N-type region 908 (n5) forms the drain of transistor M4. N-type region 910 (n6) forms the source s of transistor M7, and n-type region 912 (n7) forms the drain of transistor M7.

N-type region 914 is an N-well. P-type region 916 (p3) is formed in n-well 914 and is the source of transistor M5. P-type region 918 (p2) is also formed in n-well 914 and is the drain of transistor M5 and the drain of transistor M6. P-type region 920 (p1) is also formed in n-well 914 and is the source of transistor M6.

FIG. 9B shows the physical layout of polysilicon regions (with underlying insulating layers, which are not visible) that form the gates of the respective transistors of pixel 400. Polysilicon region 924 forms the gate g1 of transistor M1, polysilicon region 926 forms the gate g2 of transistor M2, polysilicon region 928 forms the gate g3 of transistor M3, polysilicon region 930 forms the gate g4 of transistor M4 and the gate g5 of transistor M5, polysilicon region 932 forms the gate g6 of transistor M6, and polysilicon region 934 forms the gate g7 of transistor M7.

FIG. 9C shows the interconnections between the components of pixel 400, which are formed in one or more interconnected metal layers formed over substrate 300. FIG. 9C also outlines the components that form the various transistors M1-M7. A first conductive node 940 electrically connects n-type region (n1) (the source of transistor M1) to bit line 218 (FIG. 6). A second conductive node 942 electrically connects polysilicon region (g1) (the gate of transistor M1) to word line 220. A third conductive node 944 electrically connects polysilicon region (g2) (the gate of transistor M2) to column control line 222. A fourth conductive node 946 electrically connects polysilicon region (g3) (the gate of transistor M3) to blocking signal line 408. A fifth conductive node 948 provides an electrical connection between n-type region (n3) (the drain of transistor M2), p-type region (p1) (the source of transistor M5), polysilicon region (g6) (the gate of transistor M6), and polysilicon region (g7) (the gate of transistor M7). A sixth conductive node 950 provides an electrical connection between n-type region (n6) (the source of transistor M7), p-type region (p3) (the source of transistor M6), and polysilicon regions (g4) and (g5) (the gates of transistors M4 and M5). A seventh conductive node 952 electrically connects p-type region (p2) (the drains of transistors M5 and M6) to a first voltage supply (Vdd). An eighth conductive node 954 electrically connects n-type region (n5) (the source of transistor M4) and n-type region (n7) (the source of transistor M7) to a second voltage supply (Vss). The second voltage supply (Vss) is held at a lower voltage than first voltage supply (Vdd).

The description of particular embodiments of the present invention is now complete. Many of the described features may be substituted, altered or omitted without departing from the scope of the invention. For example, the storage circuits described can be used in other types of display devices. As another example, one or more additional blocking transistors can be used at other points in the described circuits to facilitate the transition of the latch between high and low values. These and other deviations from the particular embodiments shown will be apparent to those skilled in the art, particularly in view of the foregoing disclosure.

We claim:

1. A bit storage circuit comprising:
a first voltage supply line;
a second voltage supply line;
a bit line;
a latch having an input and an output;
a first switching transistor having a first terminal, a second terminal, and a control terminal, said first switching transistor being operative to selectively provide a conductive path and a non-conductive path between said bit line and said input of said latch responsive to a first control signal being asserted on said control terminal of said first switching transistor;
a blocking transistor including a control terminal and being operative to selectively provide a conductive path and a non-conductive path between said input of said latch and said second voltage supply line responsive to a second control signal; and
a second switching transistor having a first terminal, a second terminal, and a control terminal, said second switching transistor being operative to selectively provide a conductive path and a non-conductive path between said bit line and said input of said latch responsive to a third control signal being asserted on said control terminal of said second switching transistor; and wherein
said first switching transistor and said second switching transistor are coupled in series between said bit line and said input of said latch; and
said bit storage circuit is connected to no more than one bit line.

2. The bit storage circuit of claim 1, wherein said latch includes:
a first p-channel transistor having a source terminal coupled to said first voltage supply line, a drain terminal coupled to said output of said latch, and a gate terminal coupled to said input of said latch;
a first n-channel transistor having a source terminal coupled to said second voltage supply line, a drain terminal coupled to said output of said latch, and a gate terminal coupled to said input of said latch;
a second p-channel transistor having a source terminal coupled to said first voltage supply line, a drain terminal coupled to said input of said latch, and a gate terminal coupled to said output of said latch; and
a second n-channel transistor having a source terminal coupled to said second voltage supply line, a drain terminal selectively coupled to said input of said latch via said blocking transistor, and a gate terminal coupled to said output of said latch.

3. The bit storage circuit of claim 1, wherein said latch includes:
a first p-channel transistor having a source terminal coupled to said first voltage supply line, a drain terminal coupled to said output of said latch, and a gate terminal coupled to said input of said latch;
a first n-channel transistor having a source terminal coupled to said second voltage supply line, a drain terminal coupled to said output of said latch, and a gate terminal coupled to said input of said latch;
a second p-channel transistor having a source terminal coupled to said first voltage supply line, a drain terminal coupled to said input of said latch, and a gate terminal coupled to said output of said latch; and
a second n-channel transistor having a source terminal selectively coupled to said second voltage supply line via said blocking transistor, a drain terminal coupled to said input of said latch, and a gate terminal coupled to said output of said latch.

4. The bit storage circuit of claim 1, further comprising a pixel electrode coupled to said output of said latch.

5. The bit storage circuit of claim 1, wherein said bit storage circuit includes no more than seven transistors.

6. The bit storage circuit of claim 1, further comprising a pulse generator having an output coupled to said control terminal of said blocking transistor.

7. The bit storage circuit of claim 1, wherein said control terminal of said blocking transistor is coupled to a third voltage supply line having a constant voltage between a voltage of said first voltage supply line and a voltage of said second voltage supply line, whereby said second control signal is said constant voltage, and said blocking transistor is maintained in a partially conducting state.

8. A display comprising:
a first voltage supply line;
a second voltage supply line;
an array of pixel electrodes arranged in columns and rows;
a plurality of row enable lines;
a plurality of blocking signal lines;
a plurality of bit lines; and
an array of pixel circuits arranged in columns and rows; and wherein each of said pixel circuits includes
a latch having an input coupled to one of said bit lines and an output coupled to one of said pixel electrodes;
a first switching transistor having a control terminal coupled to one of said row enable lines, said first switching transistor being operative to provide a conductive path and a non-conductive path between said bit line and said input of said latch responsive to a first control signal being asserted on said row enable line;
a blocking transistor including a control terminal coupled to one of said blocking signal lines and being operative to selectively provide a conductive path and a non-conductive path between said input of said latch and said second voltage supply line responsive to a second control signal asserted on said one of said blocking signal lines; and a plurality of column enable lines; and wherein each pixel includes a second switching transistor having a control terminal coupled to one of said column enable lines, said second switching transistor being operative to selectively provide a conductive path and a non-conductive path between said bit line and said input of said latch responsive to a third control signal being asserted on said one of said column enable lines;

said first switching transistor and said second switching transistor are coupled in series between said bit line and said input of said latch; and each said pixel circuit is coupled to no more than one of said bit lines.

9. The display of claim 8, wherein each of said latches includes:

a first p-channel transistor having a source terminal coupled to said first voltage supply line, a drain terminal coupled to said output of said latch, and a gate terminal coupled to said input of said latch;

a first n-channel transistor having a source terminal coupled to said second voltage supply line, a drain terminal coupled to said output of said latch, and a gate terminal coupled to said input of said latch;

a second p-channel transistor having a source terminal coupled to said first voltage supply line, a drain terminal coupled to said input of said latch, and a gate terminal coupled to said output of said latch; and a second n-channel transistor having a source terminal coupled to said second voltage supply line, a drain terminal selectively coupled to said input of said latch via said blocking transistor, and a gate terminal coupled to said output of said latch.

10. The display of claim 8, wherein each of said latches includes:

a first p-channel transistor having a source terminal coupled to said first voltage supply line, a drain terminal coupled to said output of said latch, and a gate terminal coupled to said input of said latch;

a first n-channel transistor having a source terminal coupled to said second voltage supply line, a drain terminal coupled to said output of said latch, and a gate terminal coupled to said input of said latch;

a second p-channel transistor having a source terminal coupled to said first voltage supply line, a drain terminal coupled to said input of said latch, and a gate terminal coupled to said output of said latch; and a second n-channel transistor having a source terminal selectively coupled to said second voltage supply line via said blocking transistor, a drain terminal coupled to said input of said latch, and a gate terminal coupled to said output of said latch.

11. The display of claim 8, wherein each said pixel circuit includes no more than seven transistors.

12. A bit storage circuit in combination with a plurality of additional bit storage circuits, said bit storage circuit and said additional bit storage circuits being arranged in an array of bit storage circuits formed in and on a p-type semiconductor substrate, said bit storage circuit comprising:

a first voltage supply line;
a second voltage supply line;
a bit line;
a latch having an input and an output;
a first switching transistor having a first terminal, a second terminal, and a control terminal, said first switching transistor being operative to selectively provide a conductive path and a non-conductive path between said bit line and said input of said latch responsive to a first control signal being asserted on said control terminal of said first switching transistor; and a blocking transistor including a control terminal and being operative to selectively provide a conductive path and a non-conductive path between said input of said latch and said second voltage supply line responsive to a second control signal; and wherein each additional bit storage circuit of said array includes at least one n-well formed in said p-type substrate;

a first p-type doped region formed in said at least one n-well;

a second p-type doped region formed in said at least one n-well;

a third p-type doped region formed in said at least one n-well;

a first n-type doped region formed in said p-type substrate;

a second n-type doped region formed in said p-type substrate;

a third n-type doped region formed in said p-type substrate;

a fourth n-type doped region formed in said p-type substrate;

a fifth n-type doped region formed in said p-type substrate;

a sixth n-type doped region formed in said p-type substrate;

a seventh n-type doped region formed in said p-type substrate;

a first polysilicon gate formed over a first area of said p-type substrate disposed between said first n-type doped region and said second n-type doped region;

a second polysilicon gate formed over a second area of said p-type substrate disposed between said second n-type doped region and said third n-type doped region;

a third polysilicon gate formed over a third area of said p-type substrate disposed between said third n-type doped region and said fourth n-type doped region;

a fourth polysilicon gate formed over a fourth area of said p-type substrate disposed between said fourth n-type doped region and said fifth n-type doped region;

a fifth polysilicon gate formed over a first area of said at least one n-well disposed between said first p-type doped region and said second p-type doped region;

a sixth polysilicon gate formed over a second area of said at least one n-well disposed between said second p-type doped region and said third p-type doped region;

a seventh polysilicon gate formed over a fifth area of said p-type substrate disposed between said sixth n-type doped region and said seventh n-type doped region; and one or more conductive layers formed over said substrate and said polysilicon gates, said one more conductive layers including a first conductive path electrically coupling said first n-type doped region to a bit line of said array, a second conductive path electrically coupling said first polysilicon gate to a first control line of said array, a third conductive path electrically coupling said second polysilicon gate to a second control line of said array, a fourth conductive path electrically coupling said third polysilicon gate to a third control line of said array, a fifth conductive path electrically coupling said third n-typed doped region, said first p-typed doped region, said sixth polysilicon gate, and said seventh polysilicon gate, a sixth conductive path electrically coupling said fourth polysilicon gate, said fifth polysilicon gate, said third p-type doped region, and said sixth n-type doped region, a seventh conductive path electrically coupling said second p-type doped region to a first voltage supply line of said array, and an eighth conductive path electrically coupling said fifth n-type doped region and said seventh n-type doped region to a second voltage supply line of said array, said second voltage supply line providing a lower voltage than said first voltage supply line.

13. The array of bit storage circuits of claim 12, wherein said array has a pitch no greater than 3 μm.

14. The array of bit storage circuits of claim 12, wherein:
said first control line of said array is a row enable line;
said second control line of said array is a column enable line; and
said sixth conductive path is electrically coupled to a pixel mirror.

15. The array of bit storage circuits of claim 12, wherein each of said first n-type doped region, said second n-type doped region, and said third n-typed doped region have an area that is larger than the area of the largest one of said fourth n-typed doped region, said fifth n-typed doped region, said sixth n-typed doped region, and said seventh n-typed doped region.

* * * * *